United States Patent
Solomko et al.

(10) Patent No.: US 9,535,140 B2
(45) Date of Patent: Jan. 3, 2017

(54) SYSTEM AND METHOD FOR A TRANSFORMER AND A PHASE-SHIFT NETWORK

(71) Applicant: Infineon Technologies AG, Neubiberg (DE)

(72) Inventors: Valentyn Solomko, Muenich (DE); Winfried Bakalski, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 556 days.

(21) Appl. No.: 13/931,092

(22) Filed: Jun. 28, 2013

(65) Prior Publication Data
US 2015/0002146 A1    Jan. 1, 2015

(51) Int. Cl.
G01R 33/02 (2006.01)
G01R 33/09 (2006.01)
H03H 7/40 (2006.01)
H03H 7/18 (2006.01)

(52) U.S. Cl.
CPC ............ *G01R 33/09* (2013.01); *H03H 7/18* (2013.01); *H03H 7/40* (2013.01)

(58) Field of Classification Search
CPC ......... G01R 33/09; G01R 27/32; G01R 27/04; G01R 27/28; G01R 27/06; G01R 27/02; G01R 29/0814; G01N 22/00; G01N 22/04
USPC .............. 324/637, 638, 642, 645, 617, 646, 521, 324/252
See application file for complete search history.

(56) References Cited

U.S. PATENT DOCUMENTS

| | | | |
|---|---|---|---|
| 4,205,282 A * | 5/1980 | Gipprich | H01P 1/185 333/103 |
| 4,951,009 A | 8/1990 | Collins | |
| 4,967,159 A * | 10/1990 | Manes | G01R 27/06 324/642 |
| 5,585,766 A | 12/1996 | Shel | |
| 5,777,475 A | 7/1998 | Vester | |
| 6,496,785 B1 | 12/2002 | Nakayama et al. | |
| 6,600,307 B2 | 7/2003 | Turski et al. | |
| 6,768,318 B2 | 7/2004 | Burt et al. | |
| 7,576,626 B2 | 8/2009 | Gorbachov | |
| 7,629,795 B2 | 12/2009 | Clunn | |

(Continued)

FOREIGN PATENT DOCUMENTS

| CN | 1298105 A | 6/2001 |
|---|---|---|
| CN | 1799033 A | 7/2006 |

(Continued)

OTHER PUBLICATIONS

Bahl, "Chapter 12 Lumped-Element Circuits," Artechhouse, Jun. 7, 2003, 42 pages.

*Primary Examiner* — Son Le
*Assistant Examiner* — Thang Le
(74) *Attorney, Agent, or Firm* — Slater Matsil LLP

(57) ABSTRACT

In accordance with an embodiment, a circuit includes a magnetic transformer having a first winding coupled between a first signal node and a second signal node, and a second winding coupled between a first reference node and a current measurement node. A phase shift network is coupled between the second node and a voltage measurement node, and the circuit is configured to indicate an impedance matching condition based on an amplitude difference and a phase difference between the voltage measurement node and the current measurement node.

34 Claims, 10 Drawing Sheets

(56) References Cited

U.S. PATENT DOCUMENTS

| | | | |
|---|---|---|---|
| 8,149,070 B2* | 4/2012 | Albag | H01P 5/10 |
| | | | 333/127 |
| 8,326,234 B2 | 12/2012 | Bakalski et al. | |
| 8,606,198 B1* | 12/2013 | Wright | H01P 5/18 |
| | | | 333/109 |
| 8,798,546 B2* | 8/2014 | Banwell | 333/109 |
| 9,061,641 B2* | 6/2015 | Lamesch | B60N 2/002 |
| 2007/0285108 A1 | 12/2007 | Nakayama et al. | |
| 2009/0098840 A1* | 4/2009 | Vaisanen | G01R 27/28 |
| | | | 455/110 |
| 2010/0019983 A1* | 1/2010 | Bonnet | H01P 5/18 |
| | | | 343/861 |
| 2010/0079218 A1* | 4/2010 | Albag | H01P 5/10 |
| | | | 333/26 |
| 2011/0102246 A1* | 5/2011 | Moulton | G01S 7/032 |
| | | | 342/159 |
| 2011/0313698 A1 | 12/2011 | Inoue et al. | |
| 2012/0001693 A1 | 1/2012 | Magoon et al. | |
| 2012/0232471 A1* | 9/2012 | Chen | G01F 23/26 |
| | | | 604/29 |
| 2013/0343107 A1* | 12/2013 | Perreault | H03H 7/38 |
| | | | 363/67 |
| 2014/0155003 A1* | 6/2014 | Nakatani | G01K 7/21 |
| | | | 455/90.2 |

FOREIGN PATENT DOCUMENTS

| | | | |
|---|---|---|---|
| CN | 1938595 A | 3/2007 | |
| CN | 101953018 A | 1/2011 | |
| DE | 69023417 T2 | 5/1996 | |
| KR | 20130070442 A | 6/2013 | |
| WO | 9517683 A1 | 6/1995 | |
| WO | 2010098909 A1 | 9/2010 | |

* cited by examiner

SYSTEM AND METHOD FOR A TRANSFORMER AND A PHASE-SHIFT NETWORK

TECHNICAL FIELD

The present disclosure relates generally to an electronic device, and more particularly to a system and method for a transformer and a phase-shift network.

BACKGROUND

Directional couplers, which are electronic devices that can detect power being transmitted in a particular direction, are used in a wide variety of radio frequency (RF) circuits. For example, a directional coupler may be used in a radar system to detect a reflected wave by separating the indecent wave from the reflected wave, or may be used in a circuit that measures the impedance mismatch of transmission lines. Functionally, a directional coupler has a forward transmission path and a coupled transmission path. The forward transmission path generally has a low loss, while the coupled transmission path couples a fraction of the transmission power that is propagated in a particular direction. There are many different types of coupler architectures that include electromagnetic couples and magnetic couplers. Each of these coupler types may be implemented using different topologies and materials depending on the frequency of operation and the operational environment.

For example, a directional coupler may be implemented using stripline structures disposed on a printed circuit board (PCB) or transformers. In some stripline implementations, various circuit elements may be as long as a quarter wavelength of the particular signal being measured. For applications that operate at frequencies between 500 MHz and 3 GHz, which covers the frequency range at which many cellular telephones operate, constructing stripline directional couplers on an integrated circuit becomes challenging dues to the wavelengths at these frequencies being much longer than the feature sizes on the integrated circuit. Low-loss magnetic-based directional couplers also are challenging to construct at this range of frequencies because of transformer losses and parasitics.

SUMMARY OF THE INVENTION

In accordance with an embodiment, a circuit includes a magnetic transformer having a first winding coupled between a first signal node and a second signal node, and a second winding coupled between a first reference node and a current measurement node. A phase shift network is coupled between the second node and a voltage measurement node, and the circuit is configured to indicate an impedance matching condition based on an amplitude difference and a phase difference between the voltage measurement node and the current measurement node.

BRIEF DESCRIPTION OF THE DRAWINGS

For a more complete understanding of the present invention, and the advantages thereof, reference is now made to the following descriptions taken in conjunction with the accompanying drawings, in which.

Figure 1A:
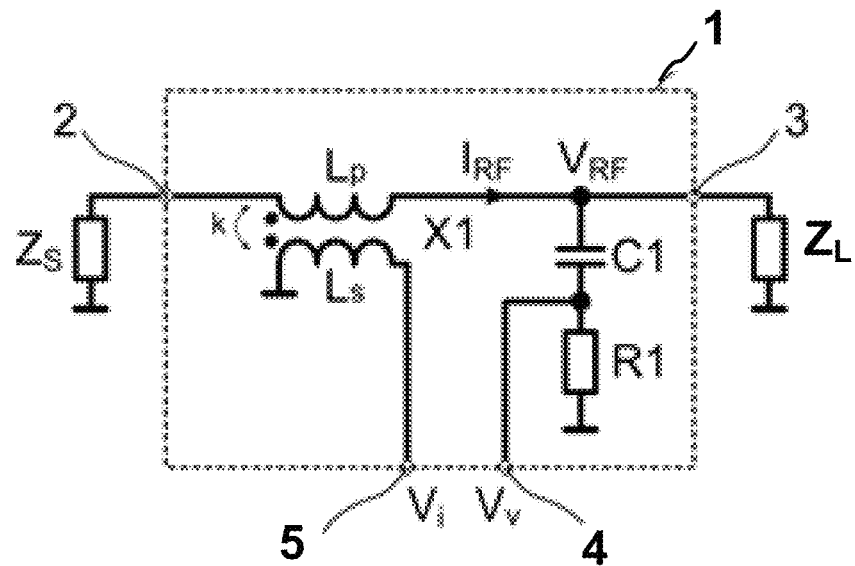
FIGS. 1a-c illustrates an embodiment coupler circuits.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for a directional coupler that may be used in RF circuits to measure incident or reflected power. The invention may also be applied to other systems and applications including other circuits that make RF measurements including, but not limited to devices that measure and/or tune impedance mismatch, time domain reflectometers (TDR), sensing devices for use with tunable antenna matching circuits, and tunable filters.

In an embodiment of the present invention, an impedance measurement device includes a phase-shift network coupled to transformer having a primary winding and secondary winding. The primary winding of the transformer is coupled in series with a transmission path of the impedance measurement device. The secondary winding of the transformer and the phase shifter is loaded by high-impedance measurement device that determines the quality of the impedance match and/or the absolute or relative magnitude and/or phase of an incident and/or reflected signal between ports of the transmission path.

In an embodiment, information about the amplitude and phase of current and voltage of the RF signal is extracted and compared with a predefined value, such as, but not limited to a 50Ω impedance. The relationship between the extracted amplitudes and phases of the RF current and voltage indicates the amount of reflection in the RF signal path and therefore indicates the load impedance. For example, the smaller the reflection, the closer the load impedance is close to the characteristic impedance $Z_0$:

$$Z_L = Z_0 \frac{1+\Gamma_0}{1-\Gamma_0},$$

where $Z_L$ represents load impedance, $Z_0$ represents the characteristic impedances, which may be 50 ΩOhms, and $\Gamma_0$ represents the reflection coefficient. In some embodiments, a magnetic transformer generates a voltage proportional to an RF current and an RC network generates voltage proportional to an RF voltage. In some embodiments, the coupler is constructed such that amplitudes and phases of the voltage proportional to the RF current and the voltage proportional to the RF voltage are 180 degrees out of phase and have the same amplitude when there is no reflection in the RF signal path.

Referring to FIG. 1a, the coupler 1 is a four-port device with ports 2 and 3 being the 50-Ohm ports for RF signal and two coupled ports 4 and 5 loaded with a high impedance. Coupler 1 includes transformer X1 with primary winding Lp coupled between source impedance $Z_S$ and load impedance $Z_L$. A phase-shifting network implemented by a high-pass RC filter that includes resistor $R_1$ and capacitor $C_1$ is coupled to the port 3. Using the equation for an ideal transformer that is loaded with a high impedance the voltage at port 5 can be expressed as:

$$V_i = -j\omega \cdot k\sqrt{L_p L_s} \cdot I_{RF}, \quad (1)$$

where $L_p$ and $L_s$ are the self-inductance of primary and secondary windings of transformer X1, and k is a coupling factor between primary and secondary windings of X1.

The voltage Vv at port 4 can be expressed as:

$$V_v = \frac{j\omega R_1 C_1}{j\omega R_1 C_1 + 1} \cdot V_{RF} \quad (2)$$

When the cut-off frequency of the RC network is well above the operating frequency range of the coupler, namely $$\omega \ll \frac{1}{R_1 C_1}, \quad (3)$$

equation (2) may be approximated as follows:

$$V_v \approx j\omega R_1 C_1 \cdot V_{RF}. \quad (4)$$

In an embodiment, the various components and parameters k, $L_P$, $L_S$, $R_1$ and $C_1$ are chosen to meet the following condition:

$$\frac{k\sqrt{L_p L_s}}{R_1 C_1} = Z_0, \quad (5)$$

where $Z_0$ is a reference impedance. In some embodiments, $Z_0$ may be set to the characteristic impedance of the system, which may be, for example, 50Ω, or another impedance. If load impedance $Z_L$ for the RF signal at port 3 is equal to the reference impedance $Z_0$, than from equations (1), (4) and (5) it follows that $$V_v + V_i = 0 \quad (6a)$$

because $|V_v|=|V_i|$ and $\angle V_v - \angle V_i = 180°$. In the case of an impedance mismatch, for example, when $Z_L \neq Z_0$, $$V_v + V_i \neq 0. \quad (6b)$$

Figure 1B:
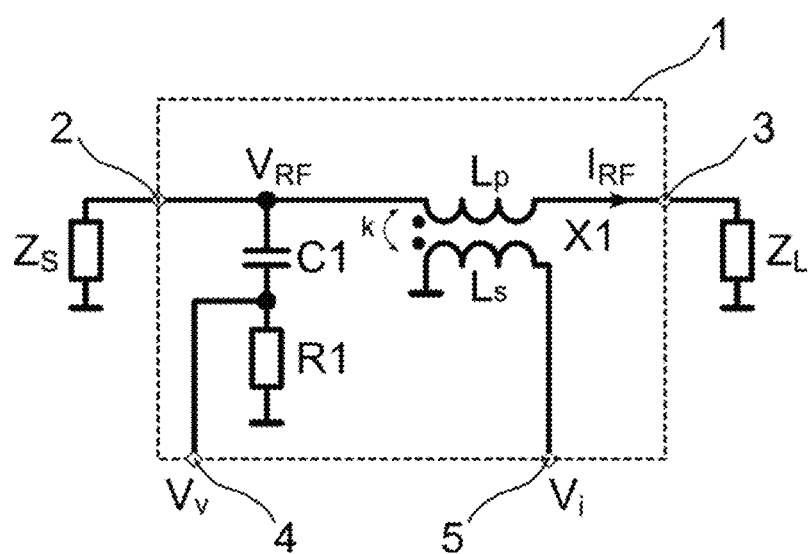
Figure 1C:
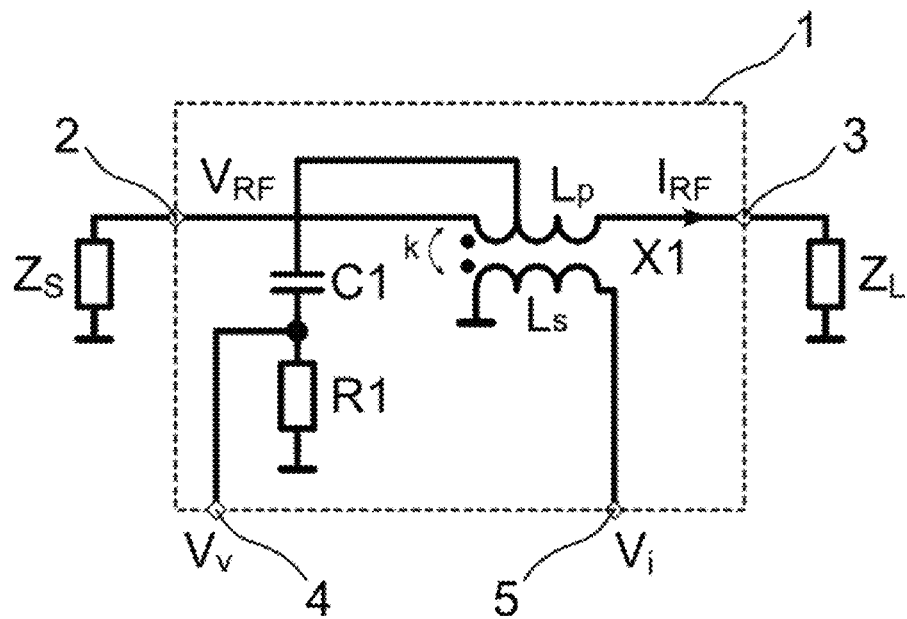

FIG. 1b illustrates a further embodiment in which the phase-shifting network is coupled to source impedance $Z_S$ via port 2 and transformer X1 is coupled to load impedance $Z_L$ via port 3, and FIG. 1c illustrates an alternative embodiment in which the phase shifting network is tapped to the first winding of transformer X1.

Figure 2A:
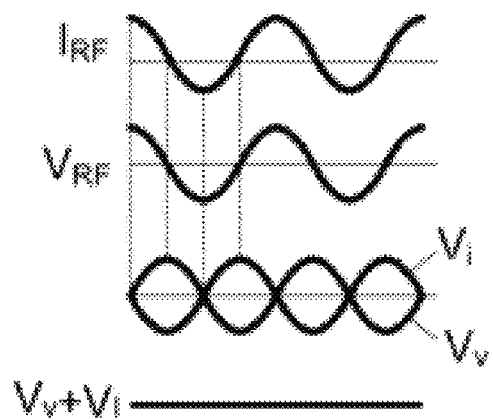
FIGS. 2a-b illustrate waveform diagrams corresponding to an embodiment coupler circuit.
Figure 2B:
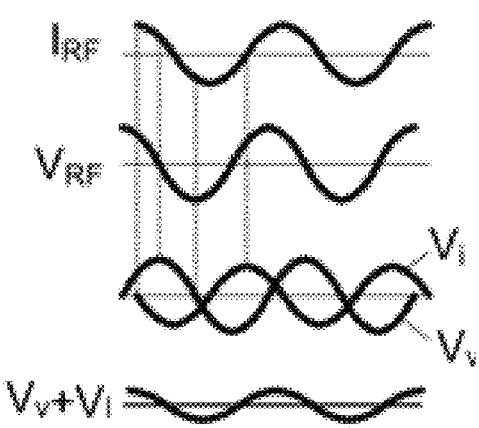

FIGS. 2a-b include waveform diagrams that illustrate the relationship between voltages Vi and Vv under matched impedance conditions and mismatched impedance conditions with respect to the circuit of FIG. 1a. FIG. 2a illustrates a waveform diagram showing the relationship between the input and output currents measurement output voltages of an embodiment coupler under matched impedance conditions. As shown, current $I_{RF}$ and voltage $V_{RF}$ are in-phase with each other with relative amplitudes that follow the following relationship:

$$\frac{V_{RF}}{I_{RF}} = Z_0.$$

Consequently, voltages Vi and Vv at port 5 and port 4 respectively have equal amplitudes and are 180 degrees out of phase with each other such that the sum of Vi and Vv is zero and/or is a DC voltage. In some embodiments, the node at port 5 that produces Vi may be referred to as a current measurement node, and the node at port 4 that produces Vv may be referred to as a voltage measurement node.

FIG. 2b illustrates a waveform diagram showing the relationship between the input and output currents measurement output voltages of an embodiment coupler under mismatched impedance conditions. As shown, current $I_{RF}$ and voltage $V_{RF}$ are out of phase with each other with relative amplitudes in which:

$$\frac{V_{RF}}{I_{RF}} \neq Z_0.$$

Under this condition, voltages Vi and Vv at port 5 and port 4, respectively have unequal amplitudes and are not 180 degrees out of phase with each other. Therefore, the sum of Vi and Vv has an AC component. It should be understood that the sum of Vi and Vv may have an AC components in conditions in which Vi and Vv are in phase with each other but have unequal amplitudes, or under conditions in which Vi and Vv are out of phase with each other but have equal amplitudes. In alternative embodiments, the amplitudes and phases of Vi and Vv may be scaled such an unequal amplitude condition and/or an out of phase condition represents a matched impedance conditions. This could occur, for example, in implementations that utilize phase shift networks that do not produce a 90° phase shift, amplitude scaling networks that produce non-equal amplitudes at matched conditions, embodiments that omit analog phase shift networks. Such embodiments may occur due to the presence of device parasitics and/or may result in situations where component values and parameters are constrained to make a 90° phase shift and matched amplitude for Vi and Vv under matched impedance conditions impractical. In such embodiments, the requisite scaling and phase shift needed to determine a matched impedance condition may be performed during post-processing in the analog or digital domain.

Embodiment couplers and impedance mismatch measurement circuits may be used to monitor incident and reflected RF power. Referring to FIG. 1, if port 2 is considered an input port and port 3 is a transmission port then the sum of signals Vv and Vi will indicate the reflected power such that the difference between Vv and Vi is proportional to incident power. For example:

$$V_{RF} = V_{RF}^+ + V_{RF}^- \qquad (7)$$

$$I_{RF} = I_{RF}^+ - I_{RF}^- = \frac{V_{RF}^+}{Z_0} - \frac{V_{RF}^-}{Z_0}, \qquad (8)$$

where $V_{RF}^+$ and $I_{RF}^+$ are incident voltage and current, $V_{RF}^-$ and $I_{RF}^-$ are the reflected voltage and current. Substituting (7) and (8) into (1) and (4) results in:

$$V_i = -j\omega \cdot k\sqrt{L_p L_s} \cdot \frac{V_{RF}^+}{Z_0} + j\omega \cdot k\sqrt{L_p L_s} \cdot \frac{V_{RF}^-}{Z_0}, \qquad (9)$$

and $$V_v \approx j\omega R_1 C_1 \cdot V_{RF}^+ + j\omega R_1 C_1 \cdot V_{RF}^-. \qquad (10)$$

According to (5):

$$\frac{k\sqrt{L_p L_s}}{R_1 C_1} = Z_0 \Rightarrow \frac{k\sqrt{L_p L_s}}{Z_0} = R_1 C_1 \qquad (11)$$

Substituting (11) into (9) results in:

$$V_i = -j\omega \cdot R_1 C_1 \cdot V_{RF}^+ + j\omega \cdot R^1 C_1 \cdot V_{RF}^- \qquad (12)$$

Finally, by adding and subtracting voltages, as shown in equations (10) and (12), reflected and incident power in the RF line can be monitored as follows:

$$V_v + V_i = 2j\omega \cdot R_1 C_1 \cdot V_{RF}^- \Rightarrow \text{reflected wave monitoring}$$

$$V_v - V_i = 2j\omega \cdot R_1 C_1 \cdot V_{RF}^+ \Rightarrow \text{incident wave monitoring.}$$

If the input and transmitted ports of the coupler are swept such that port 3 is considered an input port and port 2 is considered a transmission port, then the sum of signals Vv and Vi indicates the incident power and difference between Vv and Vi indicates the reflected power.

Figure 3A:
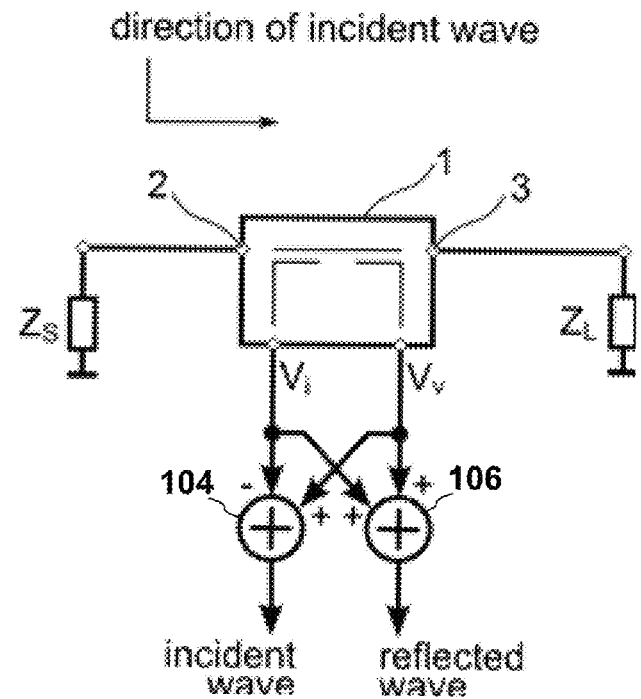
FIGS. 3a-b illustrate embodiment incident and reflected wave measurement circuits.
Figure 3B:
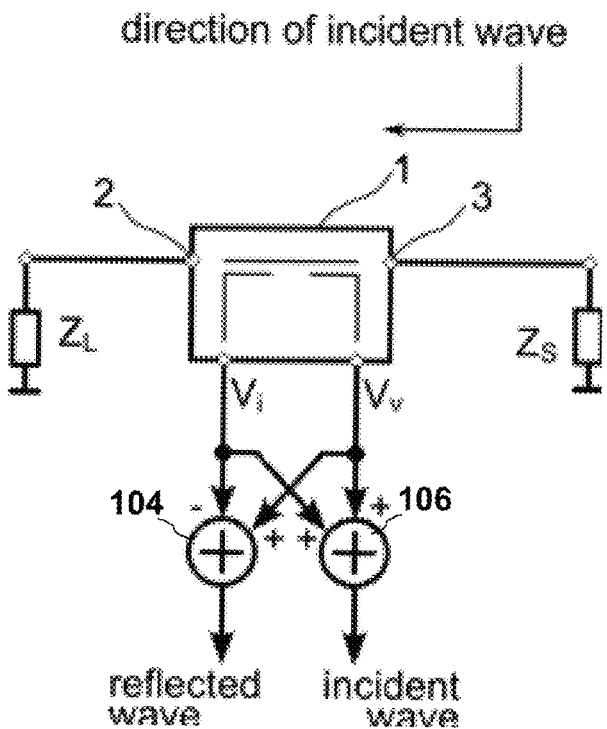

FIGS. 3*a-b* illustrate an embodiment reflection measurement circuit having embodiment coupler 1 coupled to summing blocks 104 and 106. Summing block 104 is configured to subtract Vi from Vv to produce an incident wave signal and summing block 106 is configured to add Vv to Vi to produce a reflected wave signal where the direction of the incident wave is from port 2 to port 3. FIG. 3*b* illustrates the case in which the incident wave propagates from port 3 to port 2, in which case summing block 104 produces a signal proportional to the reflected wave and summing block 106 produces a signal proportional to the incident wave.

Figure 4A:
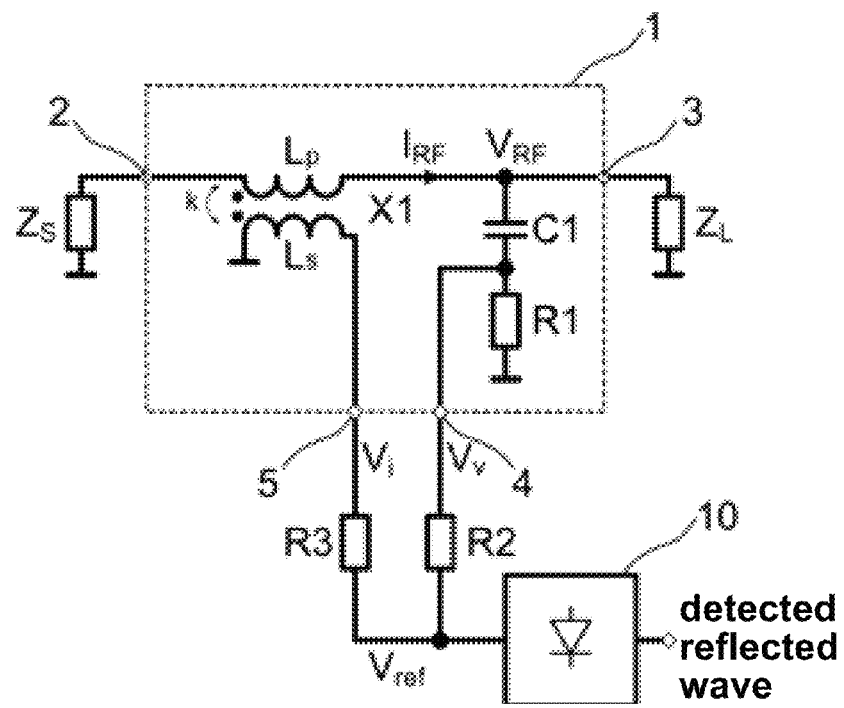
FIGS. 4a-d illustrate further embodiment incident and reflected wave measurement circuits.

FIGS. 4*a-d* illustrate various embodiment mismatch detection systems utilizing embodiment coupler circuits. For example, FIG. 4*a* illustrates coupler 1 coupled to summing resistors R2 and R3 via ports 5 and 4, respectively. RF power detector circuit 10 is coupled to resistors R2 and R3 at node $V_{ref}$. In embodiments, RF power detector circuit 10 may be implemented using various power detection circuits known in the art. For example, RF power detector 10 may be implemented using a simple diode power detector, a logarithmic power detector or other power detector circuits. In some embodiments, power detector circuit 10 may produce an analog and/or digital value that is proportional to the amount of power detected by RF power detector 10. The detected power may be, for example, proportional to the root mean square (RMS) voltage detected by power detector 10. Alternatively, other power metrics may be used. In an embodiment, voltage level detected by power detector 10 is zero, or substantially close to zero in conditions when source impedance $Z_S$ matches load impedance $Z_L$ and/or reference impedance $Z_0$. In some embodiments, power detector 10 may be omitted and node $V_{ref}$ be used as a directional coupler output for various applications.

Figure 4B:
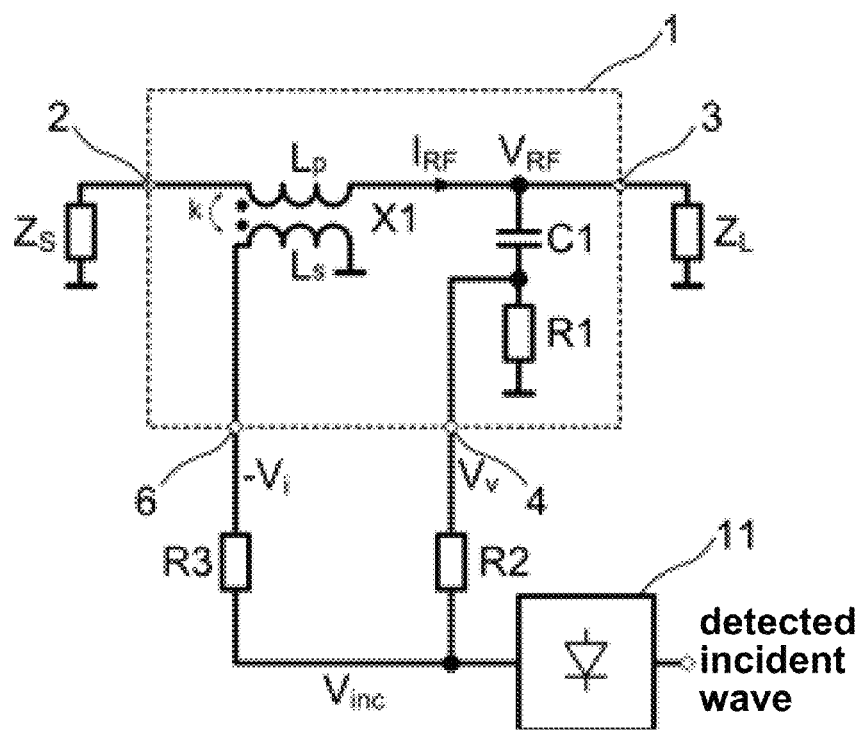

In an embodiment, incident power monitoring using an embodiment coupler circuit may be performed by an active circuitry using voltages—Vi and Vv. For example, the embodiment of FIG. 4*b* includes coupler 1, summing resistors R2 and R3 connected to ports 4 and 6, respectively of coupler 1, and RF power detector 11. It should be noted that the embodiment of FIG. 4*b* is similar to the embodiment of FIG. 4*a*, with the exception that the output of secondary winding $L_S$ is taken from an opposite end of the winding. This produces a voltage—Vi that is 180 degrees out of phase with voltage Vi, and is in-phase with voltage Vv under matched impedance conditions. Voltages—Vi and Vv are summed on resistors R2 and R3, which effectively subtracts Vi from Vv. A value proportional to the detected power of voltage $V_{inc}$ is derived based the amplitude of Vv−Vi.

Figure 4C:
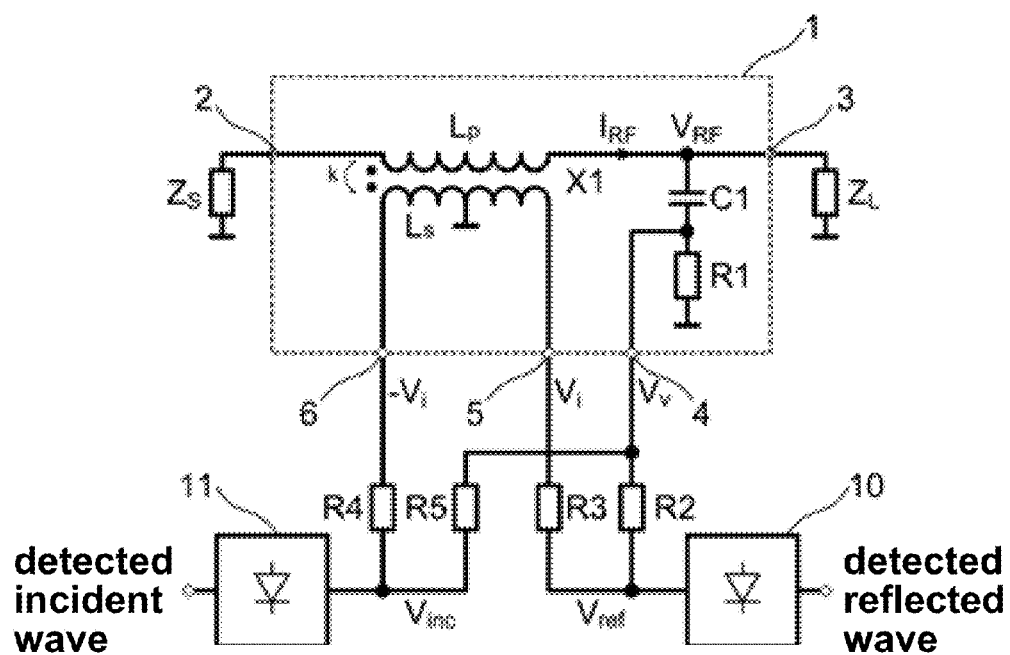

Another embodiment of the coupler shown in FIG. 4*c* allows for the simultaneous detection of incident and reflected power. In this embodiment, the secondary winding of transformer X1 is center-tapped to ground that allows for the simultaneous generation of two out-of-phase signals Vi and −Vi at ports 5 and 6. Voltage Vi is summed with voltage Vv on resistors R2 and R3 to obtain a reflected voltage Vref and voltage—Vi is summed with voltage Vv on resistors R4 and R5 to obtain the incident voltage Vinc. The amplitudes of both voltages Vref and Vinc are detected using power detectors 10 and 11.

In alternative embodiments of the present invention, summing resistors R2, R3, R4 and R5 shown in FIGS. 4*a-c* may be implemented using other impedance elements besides resistors. For example, in some embodiments, capacitors C2, C3, C4 and C5 and/or general complex impedances Z2, Z3, Z4 and Z5 representing resistances, reactances and/or complex impedances may be substituted for resistors R2, R3, R4 and R5. In embodiments using capacitances, the scaling capacitance may also serve as a DC blocking capacitor that may simplify the biasing of the RF power detector.

Figure 4D:
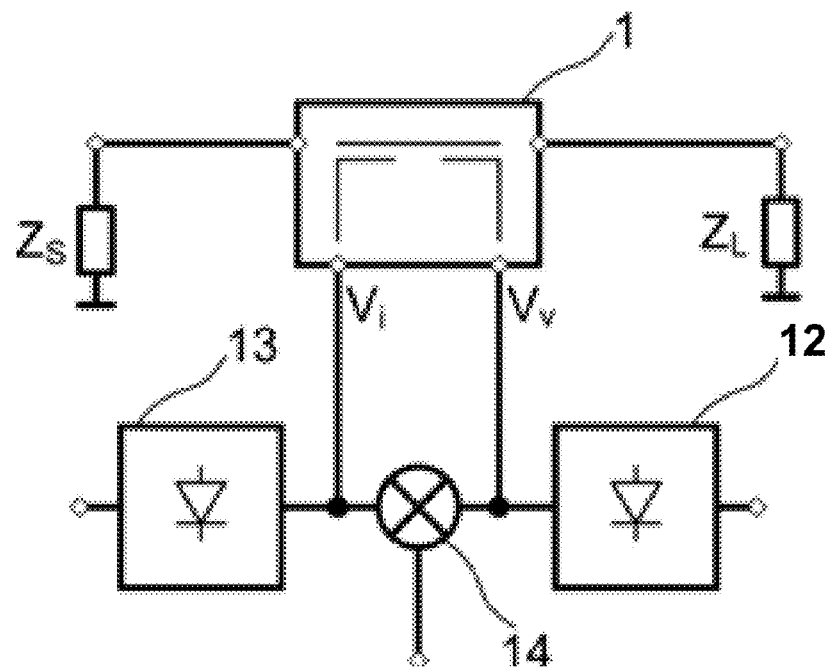

According to a further embodiment, a measurement system includes embodiment coupler 1, power detectors 12 and 13, and a phase detector 14 as shown in FIG. 4*d*. Power detectors 12 and 13 produce a value proportional to a current and voltage portion of the RF signal while the phase detector 14 detects the phase difference between the Vi and Vv. In matched conditions, the outputs of both detectors are equal to each other and the phase difference between signals is 180°. Phase detector 14 may be implemented using circuits and systems known in the art. For example, phase detector 14 may be implemented using an exclusive-or (XOR) gate, an analog mixer, a digital latch circuit, or using other circuits and methods known in the art.

Figure 5:
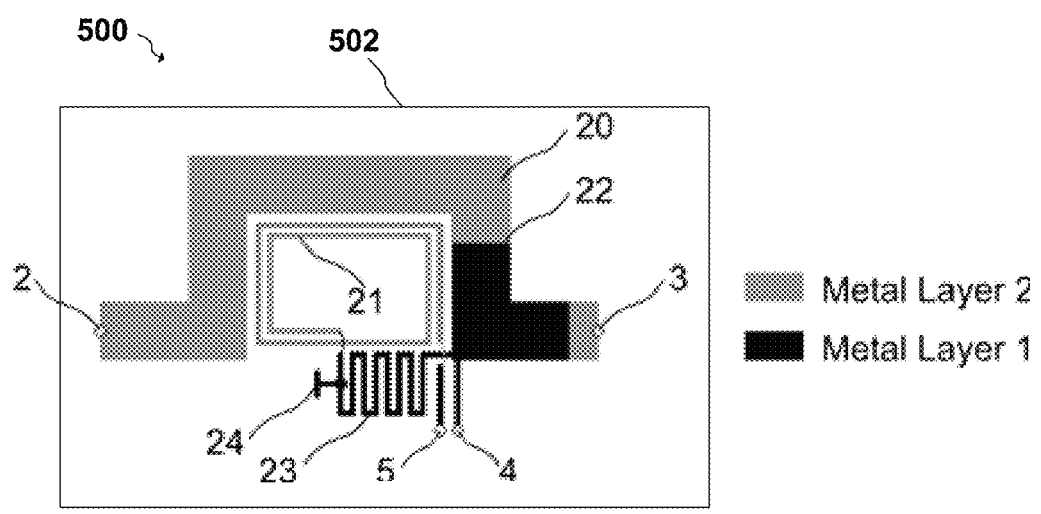
FIG. 5 illustrates an implementation of an embodiment coupler on metallization layers.

FIG. 5 illustrates a plan view of an embodiment implementation of coupler 500 that may be implemented, for example, on metallization layers of an integrated circuit. In an embodiment, the primary winding of transformer X1 is implemented using metal trace 20, and a secondary winding of transformer X1 is implemented using metal trace 21 disposed on substrate 502, which may be a semiconductor substrate. In the example of FIG. 5, the width of metal trace 20 is much wider than the width of metal trace 21 in order to provide a low impedance signal path between ports 2 and 3. Metal trace 21 may be made to be much narrower than metal trace 20 since the secondary winding is loaded by a high impedance and does not carry appreciable currents. Capacitance C1 of the phase shifter may be implemented, for example, by forming a capacitor between metal layer 2 on which primary winding metal trace 20 is implemented and metal portion 22 metal layer 1. By using the capacitance between two metal layers, a high breakdown voltage, for example, 20 V may be maintained. In embodiments that do not require high breakdown voltages, other capacitance structures may be used to implement capacitor C1, for example, by using metal-insulator-metal (MIM) capacitors, and other structures. Resistor R1 is shown implemented using a serpentine resistor 23 on metal layer 1 coupled between ground connection 24 and metal portion 22. Alternatively, other resistor structures known in the art may be used.

In the illustrated embodiment of FIG. 5, metal 2 is an upper layer of metal and/or a top metal layer and metal 1 is a lower metal layers. In semiconductor processes in which the top layer or upper layers of metal are thicker than lower layers of metal, the top or upper layers of metal may be used to provide a lower resistance path for metal trace 20 in order to implement a low-loss coupler. In some embodiments, the loss of coupler 500 may be about 0.2 dB or lower. Alternatively, other coupler losses may result depending on the particular implementation and its specifications.

Coupler 500 may be coupled to one or more embodiment power detectors via port connection 4 coupled to metal trace 22 of capacitor C1, and to port connection 5 that is coupled to metal trace 21. It should be appreciated that the embodiment shown in FIG. 5 is just one example of many possible embodiment coupler implementations. In alternative embodiments, other geometries and topologies may be used. In further examples, coupler 500 may be implemented on a printed circuit board or other substrate. Moreover, embodiment couplers may be implemented using metallization layers that are different from metal 1 and metal 2 in other embodiments.

Figure 6A:
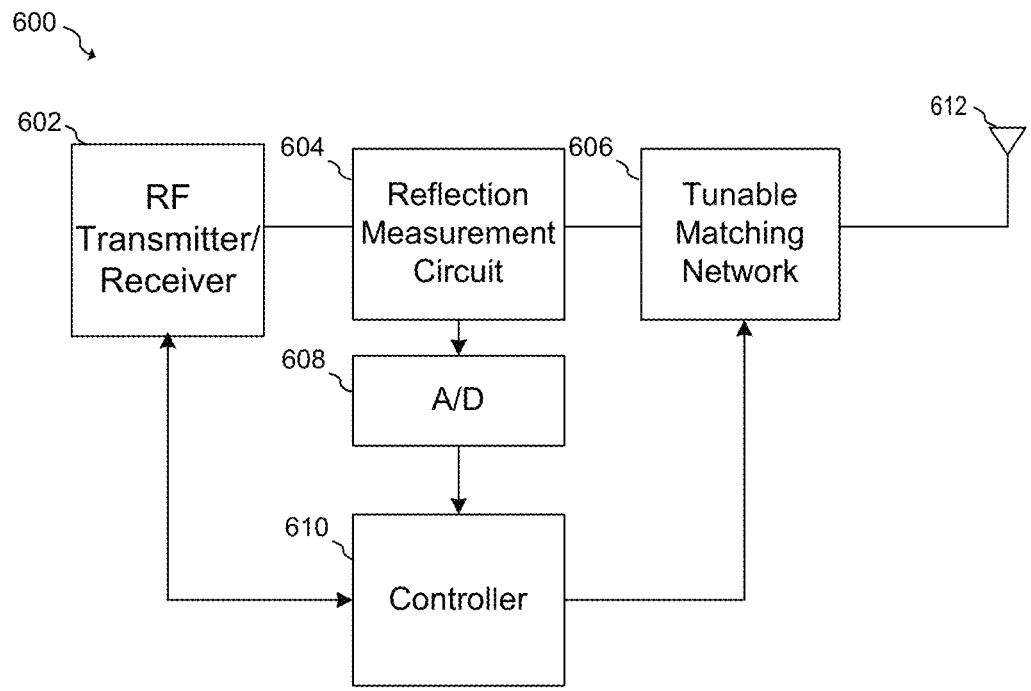
FIGS. 6a-c illustrate various embodiment RF systems.

FIG. 6a illustrates RF system 600 according to an embodiment of the present invention. System 600 includes RF transceiver 602 coupled to antenna 612 via embodiment reflection measurement circuit 604 and tunable matching network 606. The power measurement output of reflection measurement circuit 604 is coupled to A/D converter 608, the output of which is coupled to controller 610. In an embodiment, controller 610 adjusts tunable matching network 606 according to the digitized output of A/D converter 608. When reflection measurement circuit 604 detects an impedance mismatch between the RF transceiver 602 and the input to tunable matching network 606, controller 610 adjusts tunable matching network 606 until the measured it mismatch in impedance falls below a predetermined threshold in some embodiments. In some embodiments, controller 610 may be implemented, for example, using a processor, microcontroller, or dedicated system logic. RF system 600 may be implemented, for example, in the front end of a cellular telephone, wireless local area network transceiver, or other radio frequency system. In some embodiments, tunable matching network 606 is coupled between RF transceiver 602 and reflection measurement circuit 604, as shown in FIG. 6b with respect to system 620.

Figure 6B:
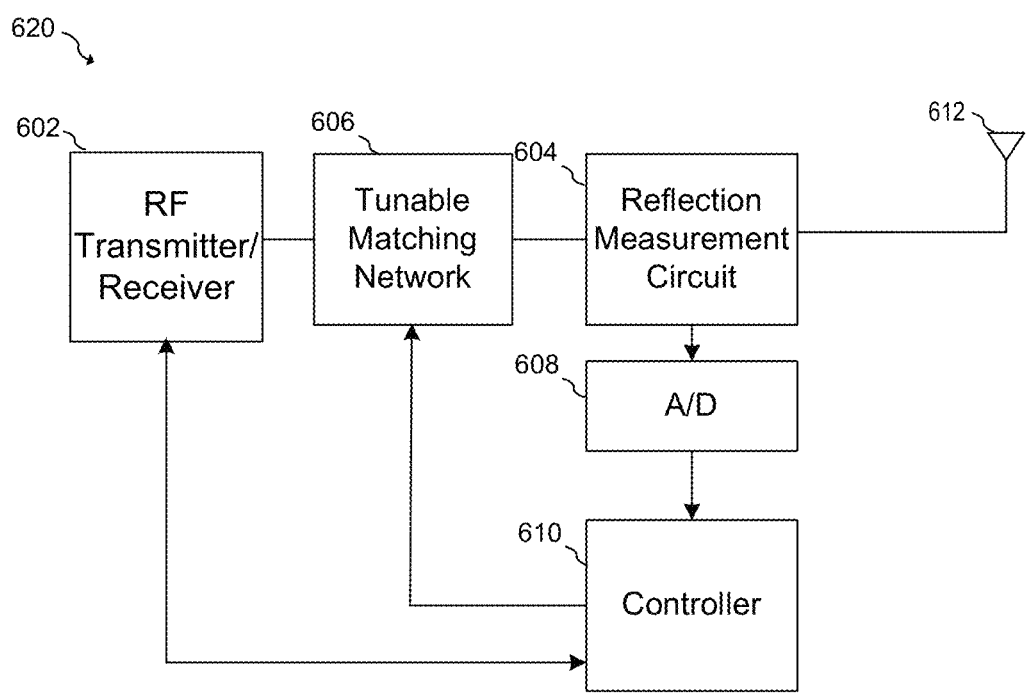
Figure 6C:
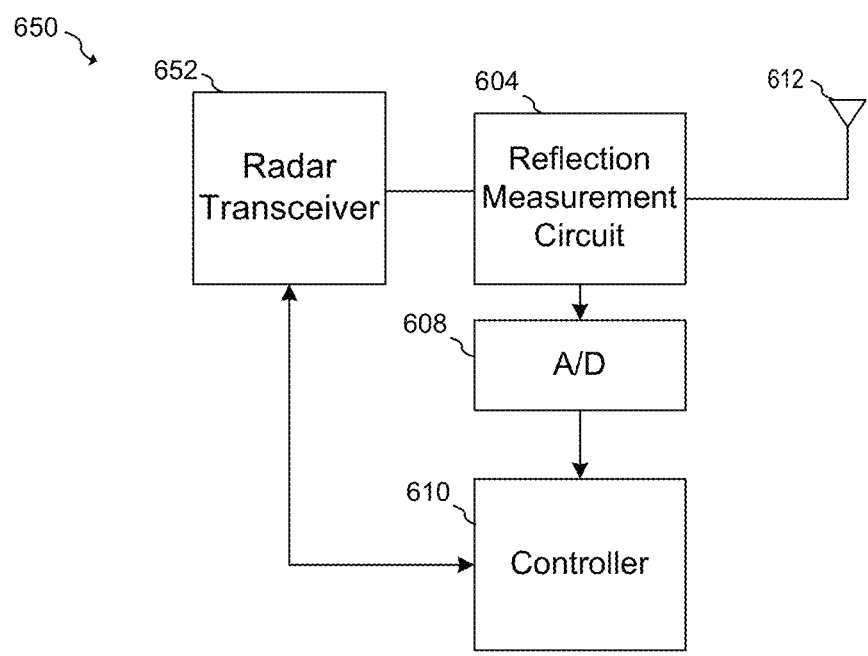

FIG. 6c illustrates embodiment radar system 650 according to another embodiment of the present invention. System 650 includes radar transceiver 652 coupled to antenna 612 via embodiment reflection measurement circuit 604. The output of the reflection measurement circuit 604 is coupled to the controller 610 via analog to digital converter 608. In an embodiment, reflection measurement circuit 604 measures an incident signal from antenna 612 that may represent a reflected radar pulse. System 650 may be used, for example, a radar system such as automotive or proximity radar systems. Reflection measurement circuit 604 may be implemented, for example, using the embodiments of FIG. 4c and/or 4d. Other example systems that may utilize embodiment reflection measurement circuits include power monitoring in planar inverted F antenna (PIFA) feed-point tuners.

It should be appreciated that the embodiment shown in FIGS. 6a-c are just three examples of the many embodiment systems that may be implemented using embodiment of reflection measurement circuits.

Figure 7A:
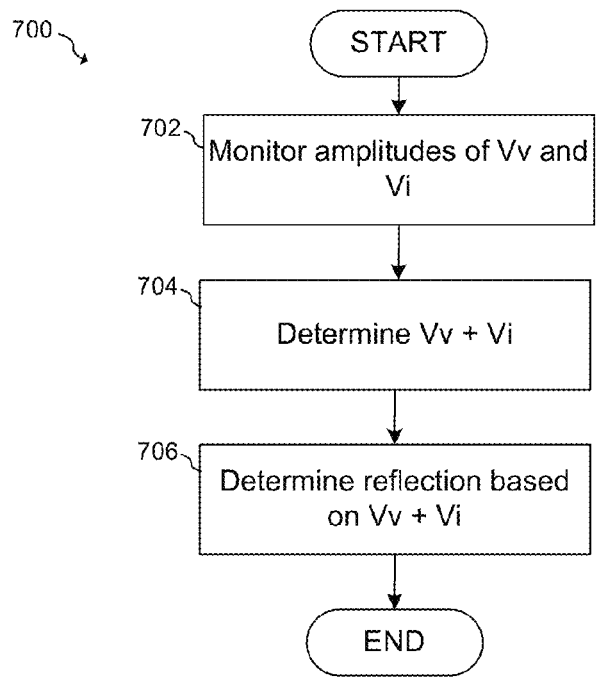
FIGS. 7a-b illustrate block diagrams of embodiment methods.

FIG. 7a illustrates a block diagram 700 of a method of using an embodiment coupler. In step 702, the amplitudes of Vv and Vi corresponding to the outputs of ports 4 and 5 illustrated in FIG. 1a are monitored. Next, in step 704, the sum of Vv and Vi is determined, for example, using a resistive summing network such at that shown in FIG. 4a. Alternatively, a capacitive summing network may be used, and or summing network including impedances that have various real and/or reactive components. In further embodiments, this summing may be performed in the digital domain. In step 706, a magnitude of a reflection between a source and load impedance is determined based on the sum of Vv and Vi. In some embodiments, the amplitude of the sum of Vv and Vi is proportional to the magnitude of the measured reflection. The sum of the amplitude may be measured, for example, using an RF power detector.

Figure 7B:
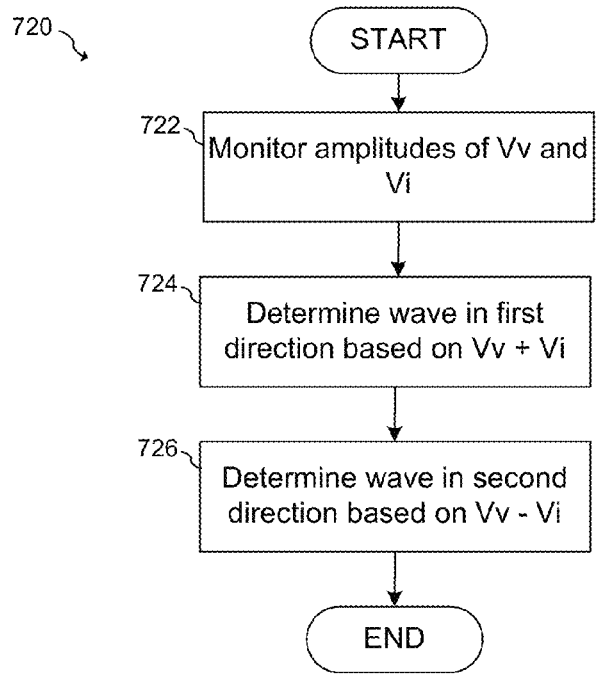

FIG. 7b illustrates a block diagram 720 of a method of using an embodiment coupler to measure incident and reflected waves. In step 722, the amplitudes of Vv and Vi corresponding to the outputs of ports 4 and 5 illustrated in FIG. 1a are monitored. Next, in step 724, the sum of Vv and Vi is determined, for example, using a resistive summing network such at that shown in FIG. 4a. The amplitude of the sum is proportional to a magnitude of a wave propagating in a first direction. In step 726, the difference between Vv and Vi is determined, such that the amplitude of the difference is proportional to a magnitude of a wave propagating in a second direction opposite the first direction. This difference may be determined, for example, by using the circuit described with respect to FIGS. 4b and 4c.

Alternatively, a capacitive summing network may be used, and or summing network including impedances that have various real and/or reactive components. In further embodiments, this summing may be performed in the digital domain. In step 706, a magnitude of a reflection between a source and load impedance is determined based on the sum of Vv and Vi. In some embodiments, the amplitude of the sum of Vv and Vi is proportional to the magnitude of the measured reflection. The sum of the amplitude may be measured, for example, using an RF power detector.

Figure 8A:
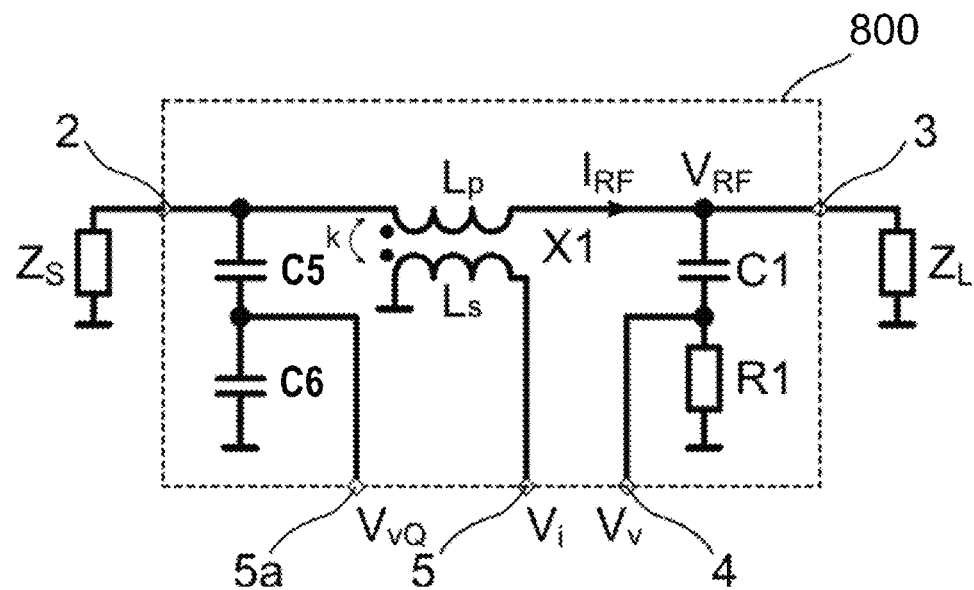
FIGS. 8a-b illustrate further embodiment incident and reflected wave measurement circuits.
Figure 8B:
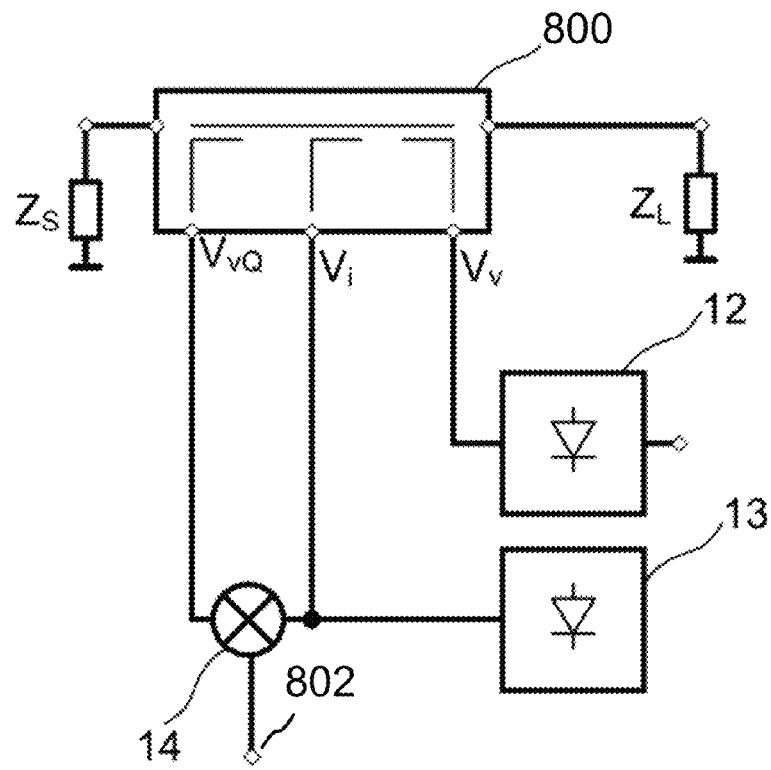

FIG. 8a illustrates an embodiment coupler 800 that is similar to the coupler shown in FIG. 1a, with the addition of a capacitive divider formed by capacitors C5 and C6 that may be coupled to the primary winding of transformer X1. In an embodiment, $V_{vQ}$ is in-phase with the voltage $V_{RF}$ such that voltage $V_{vQ}$ at port 5a and $V_i$ at port 5 has a 90 degree phase difference in matched conditions. FIG. 8b illustrates a reflection measurement system using coupler 800, phase detector 14 and RF power detectors 12 and 13. In an embodiment, output 802 of phase detector 14 has a zero and/or minimum output in matched conditions that does not depend on the amplitude of the RF signal at the source or load ports of coupler 800. Thus, in some embodiments, matched conditions may be recognized without calibrating out the effect of the amplitude of signals present at the source and load ports of coupler 800.

In accordance with an embodiment, a circuit includes a magnetic transformer having a first winding coupled between a first signal node and a second signal node, and a second winding coupled between a first reference node and a current measurement node. A phase shift network is coupled between the second node and a voltage measurement node, and the circuit is configured to indicate an impedance matching condition based on an amplitude difference and a phase difference between the voltage measurement node and the current measurement node. The first signal node may be configured to be coupled to an RF signal source, and the second signal node may be configured to be coupled to an RF load, and in some embodiment, the circuit includes RF signal source and the RF load.

In an embodiment, the phase shift network is coupled to the second signal node via a tapped connection on the first winding and/or the phase shift network is configured to provide a 90° phase shift. The phase shift network may include a capacitor coupled between the second signal node and the voltage measurement node, and a resistor coupled between the voltage measurement node and a second reference node. In some embodiments, the first reference node and the second reference node are ground nodes.

In an embodiment, the circuit further includes a detection circuit coupled to the voltage measurement node and the current measurement node. The detection circuit may include an RF power detector having an input coupled to the voltage measurement node and the current measurement node. In some embodiments, the detection circuit includes a first impedance coupled between the current measurement node and a sensing node, and a second impedance coupled between the voltage measurement node and the sensing node. An RF power detector may be coupled to the sensing node.

In an embodiment, the first impedance includes a first resistor and the second impedance includes a second resistor. Alternatively, the first impedance includes a first capacitor and the second impedance includes a second capacitor. The detection circuit may be configured to indicate an impedance match between a reference impedance coupled to the first node and a load impedance coupled to the second node when an output of the RF power detector indicates a minimum power level.

In some embodiments, the detection circuit includes a first RF power detector coupled to the current measurement node, a second RF power detector coupled to the voltage measurement node, and a mixer having a first input coupled to the current measurement node, and second input coupled to the voltage measurement node. The circuit may further include a capacitive divider having an input coupled to the first signal node, a first RF power detector coupled to the current measurement node, a second RF power detector coupled to the voltage measurement node, and a mixer having a first input coupled to an output of the capacitive divider network, and second input coupled to the current measurement node.

In accordance with a further embodiment, a method of operating a reflection measurement circuit includes the steps of monitoring and measuring. The reflection measurement circuit includes a magnetic transformer and a phase shift network. The magnetic transformer has a first winding coupled between a first signal node and a second signal node and a second winding coupled between a first reference node and a current measurement node, and the phase shift network is coupled between the load node and a voltage measurement node. The step of monitoring includes monitoring amplitudes of the voltage measurement node and the current measurement node, and the step of measuring includes measuring a reflection between a first impedance coupled to the first signal node and a second impedance coupled to the second signal node based on the monitoring. In some embodiments, the method further includes determining an impedance mismatch based on the measured reflection.

The step of measuring the reflection may include adding a signal at the voltage measurement node to a signal at the current measurement node to form a summed signal, such that an amplitude of the summed signal is proportional to a reflection coefficient describing a reflection from the load impedance to the source impedance.

In an embodiment, the method further includes measuring the amplitude of the summed signal using a power detector, and may further include measuring an amplitude of the current measurement node using a first power detector, and measuring an amplitude of the voltage measurement node using a second power detector. In some embodiments, the method also includes determining a phase difference between the current measurement node and the voltage measurement node. Determining the phase difference may include, for example, using a phase detector having inputs coupled to the current measurement node and the voltage measurement node.

In an embodiment, the method further includes measuring a wave in a first direction, which includes adding a signal at the voltage measurement node to a signal at the current measurement node to form a summed signal, and measuring a wave in a second direction, which includes subtracting a signal at the current measurement node to a signal at the voltage measurement node to form a subtracted signal.

In accordance with a further embodiment, a semiconductor circuit includes a semiconductor substrate, a magnetic transformer, and a phase shift network. The magnetic transformer includes a primary metallization trace disposed on the semiconductor substrate, and a secondary metallization trace disposed adjacent to the primary metallization trace. A first end of the primary metallization trace is configured to be coupled to a reference impedance and a second end of the primary metallization trace is configured to be coupled to a load impedance, and the first end of the secondary metallization trace is configured to be coupled to a first reference voltage node and a second end is configured to be coupled to a current measurement node. The phase shift network has a first node coupled to the second end of the first of metallization trace and a voltage measurement node.

In an embodiment, the phase shift network includes a capacitor coupled between the second of the primary metallization trace and the voltage measurement node, and a resistor coupled between the voltage sensing node and a second reference voltage node. The capacitor may be implemented using a metallization area capacitively coupled to the primary metallization trace, and the resistor may be implemented using a metal resistor. In some embodiments, the semiconductor circuit further includes an RF power detector having an input coupled to the voltage measurement node and the current measurement node.

In an embodiment, the semiconductor circuit also includes a first impedance coupled between the current measurement node and a sensing node, and a second impedance coupled between the voltage measurement node and the sensing node. The first impedance may include a first resistor and the second impedance may include a second resistor. In some embodiments, the first impedance may include a first capacitor and the second impedance may include a second capacitor. The semiconductor circuit may also include an RF power detector having an input coupled to the sensing node.

Advantages of embodiments of the present invention include the ability to implement a directional coupler and/or impedance mismatch measurement device that has a very low insertion loss, a small form factor suitable for integration on-chip, and the ability to operate at low RF frequencies, for example, between 500 MHz and 3 GHz.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

What is claimed is:

1. A circuit comprising:
   a magnetic transformer comprising a first winding coupled between a first signal node and a second signal node, and a second winding coupled between a first reference node and a current measurement node, the first reference node configured to be coupled to a DC reference voltage; and
   a phase shift network coupled between the second signal node and a voltage measurement node, wherein the circuit is configured to indicate an impedance matching condition based on an amplitude difference and a phase difference between the voltage measurement node and the current measurement node.

2. The circuit of claim 1, wherein:
   the first signal node is configured to be coupled to an RF signal source; and
   the second signal node is configured to be coupled to an RF load.

3. The circuit of claim 2, further comprising the RF signal source and the RF load.

4. The circuit of claim 1, wherein the phase shift network is coupled to the second signal node via a tapped connection on the first winding.

5. The circuit of claim 1, wherein the phase shift network is configured to provide a 90° phase shift.

6. The circuit of claim 1, wherein the phase shift network comprises:
   a capacitor coupled between the second signal node and the voltage measurement node; and
   a resistor coupled between the voltage measurement node and a second reference node.

7. The circuit of claim 6, wherein the first reference node and the second reference node are ground nodes.

8. The circuit of claim 1, further comprising a detection circuit coupled to the voltage measurement node and the current measurement node.

9. The circuit of claim 8, wherein the detection circuit comprises an RF power detector having an input coupled to the voltage measurement node and the current measurement node.

10. The circuit of claim 8, wherein the detection circuit comprises:
    a first impedance coupled between the current measurement node and a sensing node; and
    a second impedance coupled between the voltage measurement node and the sensing node.

11. The circuit of claim 10, further comprising an RF power detector having an input coupled to the sensing node.

12. The circuit of claim 10, wherein the first impedance comprises a first resistor and the second impedance comprises a second resistor.

13. The circuit of claim 10, wherein the first impedance comprises a first capacitor and the second impedance comprises a second capacitor.

14. The circuit of claim 9, wherein the detection circuit is configured to indicate an impedance match between a reference impedance coupled to the first signal node and a load impedance coupled to the second signal node when an output of the RF power detector indicates a minimum power level.

15. The circuit of claim 8, wherein the detection circuit comprises:
    a first RF power detector coupled to the current measurement node;
    a second RF power detector coupled to the voltage measurement node; and
    a mixer having a first input coupled to the current measurement node, and second input coupled to the voltage measurement node.

16. The circuit of claim 1, further comprising:
    a capacitive divider network having an input coupled to the first signal node;
    a first RF power detector coupled to the current measurement node;
    a second RF power detector coupled to the voltage measurement node; and
    a mixer having a first input coupled to an output of the capacitive divider network, and second input coupled to the current measurement node.

17. A method of operating a reflection measurement circuit comprising a magnetic transformer having a first winding coupled between a first signal node and a second signal node, and a second winding coupled between a first reference node and a current measurement node, the first reference node configured to be coupled to a DC reference voltage; and a phase shift network coupled between the second signal node and a voltage measurement node, wherein the method comprises:
    monitoring amplitudes of the voltage measurement node and the current measurement node; and
    measuring a reflection between a first impedance coupled to the first signal node and a second impedance coupled to the second signal node based on the monitoring.

18. The method of claim 17, further comprising determining an impedance mismatch based on the measured reflection.

19. The method of claim 17, wherein measuring the reflection comprises adding a signal at the voltage measurement node to a signal at the current measurement node to form a summed signal, wherein an amplitude of the summed signal is proportional to a reflection coefficient describing a reflection from a load impedance to a source impedance.

20. The method of claim 19, further comprising measuring the amplitude of the summed signal using a power detector.

21. The method of claim 19, further comprising:
    measuring an amplitude of the current measurement node using a first power detector; and
    measuring an amplitude of the voltage measurement node using a second power detector.

22. The method of claim 21, further comprising determining a phase difference between the current measurement node and the voltage measurement node.

23. The method of claim 22, wherein determining the phase difference comprises using a phase detector having inputs coupled to the current measurement node and the voltage measurement node.

24. The method of claim 17, further comprising:
measuring a wave in a first direction comprising adding a signal at the voltage measurement node to a signal at the current measurement node to form a summed signal; and
measuring a wave in a second direction comprising subtracting a signal at the current measurement node to a signal at the voltage measurement node to form a subtracted signal.

25. The method of claim 17, wherein the DC reference voltage is a ground voltage.

26. A semiconductor circuit comprising:
a semiconductor substrate;
a magnetic transformer comprising;
a primary metallization trace disposed on the semiconductor substrate, wherein a first end of the primary metallization trace is configured to be coupled to a reference impedance and a second end of the primary metallization trace is configured to be coupled to a load impedance; and
a secondary metallization trace disposed adjacent to the primary metallization trace, wherein a first end of the secondary metallization trace is configured to be coupled to a first reference voltage node and a second end is configured to be coupled to a current measurement node, wherein the first reference voltage node is configured to be coupled to a DC reference voltage; and
a phase shift network having a first node coupled to the second end of the primary metallization trace and a voltage measurement node.

27. The semiconductor circuit of claim 26, wherein the phase shift network comprises:
a capacitor coupled between the second end of the primary metallization trace and the voltage measurement node; and
a resistor coupled between the voltage sensing node and a second reference voltage node.

28. The semiconductor circuit of claim 27, wherein:
the capacitor comprises a metallization area capacitively coupled to the primary metallization trace; and
the resistor comprises a metal resistor.

29. The semiconductor circuit of claim 26, further comprising an RF power detector having an input coupled to the voltage measurement node and the current measurement node.

30. The semiconductor circuit of claim 26, further comprising:
a first impedance coupled between the current measurement node and a sensing node; and
a second impedance coupled between the voltage measurement node and the sensing node.

31. The semiconductor circuit of claim 30, further comprising an RF power detector having an input coupled to the sensing node.

32. The semiconductor circuit of claim 30, wherein the first impedance comprises a first resistor and the second impedance comprises a second resistor.

33. The semiconductor circuit of claim 30, wherein the first impedance comprises a first capacitor and the second impedance comprises a second capacitor.

34. The circuit of claim 26, wherein the DC reference voltage is a ground voltage.

* * * * *